United States Patent [19]

Malekzadeh et al.

[11] 4,152,178

[45] May 1, 1979

[54] SINTERED RARE EARTH-IRON LAVES PHASE MAGNETOSTRICTIVE ALLOY PRODUCT AND PREPARATION THEREOF

[75] Inventors: Manoochehr Malekzadeh; Milton R. Pickus, both of Oakland, Calif.

[73] Assignee: The United States of America as represented by the United States Department of Energy, Washington, D.C.

[21] Appl. No.: 871,919

[22] Filed: Jan. 24, 1978

[51] Int. Cl.² ............................................. H01F 1/02
[52] U.S. Cl. .................................. 148/103; 148/105; 148/31.55; 252/62.55
[58] Field of Search ...................... 148/31.57, 103, 105, 148/31.55, 104; 252/62.55

[56] References Cited

U.S. PATENT DOCUMENTS

| | | | |
|---|---|---|---|
| 2,384,215 | 9/1945 | Toulin | 148/105 |
| 2,813,789 | 11/1957 | Glaser | 148/103 |
| 3,424,578 | 1/1969 | Strnat et al. | 148/103 |
| 3,663,317 | 6/1972 | Westendorp et al. | 148/103 |
| 3,723,197 | 3/1973 | Buschow et al. | 148/103 |

OTHER PUBLICATIONS

M. G. Benz et al., "Cobalt–Samarium Magnets Prepared by Liquid Phase Sintering," *App. Phys. Lett.* 17, No. 4, 176, Aug. 15, 1970.

M. Malekzadeh et al., "Sintering Studies of Rare Earth-Iron Laves Phase Magnetostrictive Compounds," *Mat. Res. Bull.* 11, 1419 (1976).

*Primary Examiner*—L. Dewayne Rutledge
*Assistant Examiner*—John P. Sheehan
*Attorney, Agent, or Firm*—Roger S. Gaither; Irene S. Croft; William S. Bernheim

[57] ABSTRACT

A sintered rare earth-iron Laves phase magnetostrictive alloy product characterized by a grain oriented morphology. The grain oriented morphology is obtained by magnetically aligning powder particles of the magnetostrictive alloy prior to sintering. Specifically disclosed are grain oriented sintered compacts of $Tb_xDy_{1-x}Fe_2$ and their method of preparation. The present sintered products have enhanced magnetostrictive properties.

8 Claims, 6 Drawing Figures

SINTERED RARE EARTH-IRON LAVES PHASE MAGNETOSTRICTIVE ALLOY PRODUCT AND PREPARATION THEREOF

BACKGROUND OF THE INVENTION

The invention described herein was made at Lawrence Berkeley Laboratory in the course of or under the United States Department of Energy Contract No. W-7405-ENG-48 with the University of California.

This invention relates to a sintered rare earth-iron Laves phase magnetostrictive alloy product of enhanced magnetostrictive properties and its method of preparation.

Recently, a number of studies have been carried out on the magnetic properties of rare earth-iron Laves phase compounds. Of particular interest are the high room temperature magnetostrains observed in several of these compounds which makes them promising for a variety of technological applications, for example, early detection of flaws in nuclear reactors, sonar, etc. An inherent feature of these intermetallic compounds is their brittleness which precludes the use of common forming methods such as those employed for nickel based magnetostrictive alloys. A liquid phase sintering method for obtaining these Laves compounds in suitable sizes and shapes is described in M. Malekzadeh, M. P. Dariel, and M. R. Pickus, "Sintering Studies of Rare Earth-Iron Laves Phase Magnetostrictive Compounds," Mat. Res. Bull. 11, 1419 (1976).

The preparation of cobalt-samarium ($Co_5Sm$) permanent magnets of high coercive force by a liquid phase sintering process which includes the step of aligning the $Co_5Sm$ powder in an axial magnetic field is known. This process is described in M. G. Benz and D. L. Martin, "Cobalt-Samarium Magnets Prepared by Liquid Phase Sintering," App. Phys. Lett. 17, No. 4, 176, Aug. 15, 1970. However, the objectives and crystallographic mechanisms involved in the magnetically soft magnetostrictive compounds are in no way related to those involved in the magnetically hard $Co_5Sm$-type permanent magnets.

SUMMARY OF THE INVENTION

The present invention provides a sintered rare earth-iron Laves phase magnetostrictive alloy product of enhanced magnetostrictive properties. Rare earth-iron Laves phase compounds are compounds of the type $RFe_2$ wherein R represents one or more rare earth metals. The sintered product of this invention has a grain oriented morphology achieved by aligning the particles of the rare earth-iron magnetostrictive compound in a magnetic field prior to sintering. It has been found that this grain oriented product has superior magnetostriction compared with randomly oriented products of similar composition.

Particularly suitable magnetostrictive compounds for use in the present invention are those having an axis of easy magnetization along the major cubic symmetry [111] direction, specifically, pseudobinary terbium-dysprosium-iron compounds having the formula $(T_xDy_{1-x})Fe_2$ where x is at least 0.3.

It is, therefore, an object of this invention to provide a sintered rare earth-iron Laves phase magnetostrictive alloy product of enhanced magnetostrictive properties.

It is another object of this invention to provide a method for preparing a sintered rare earth-iron Laves phase magnetostrictive alloy product having enhanced magnetostrictive properties.

Other objects and advantages will become apparent from the following detailed description made with reference to the accompanying drawings.

DETAILED DESCRIPTION OF THE INVENTION

Figure 1:
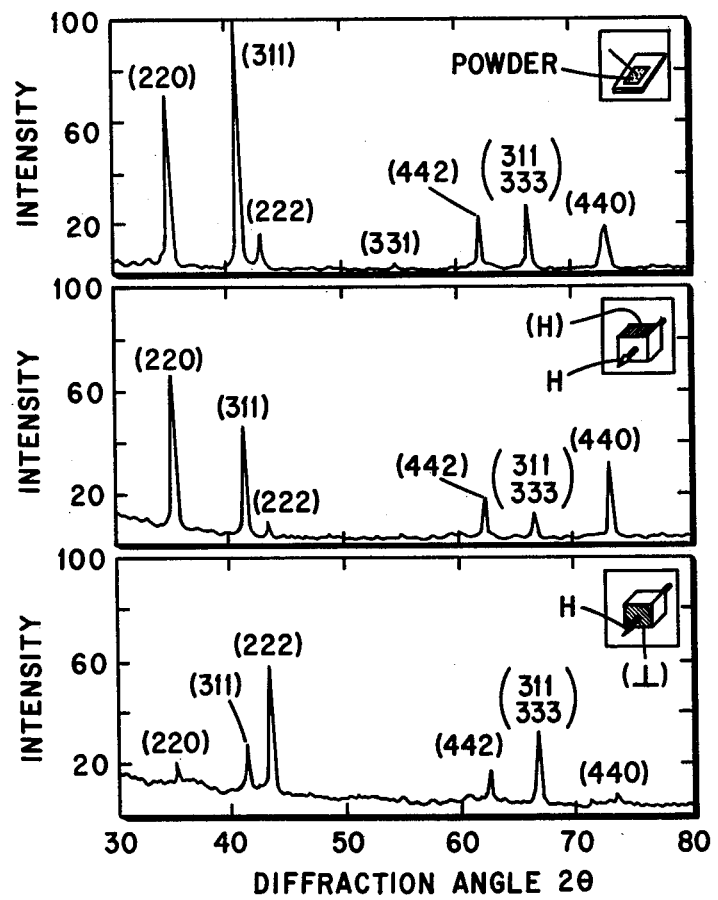
FIG. 1 shows the X-ray diffraction patterns of random and magnetically oriented $Tb_{0.3}Dy_{0.7}Fe_2$ compound.

The magnetostrictive sintered product of the present invention consists essentially of a compact body compounded of particles of a rare earth-iron Laves phase magnetostrictive compound and has a grain oriented morphology achieved by aligning the particles under the influence of a magnetic field prior to sintering. The present magnetostrictive product is prepared by subjecting powder particles of a rare earth-iron Laves phase magnetostrictive compound to a magnetic field sufficient to substantially align the particles, compacting the magnetically aligned particles, and sintering the resulting compact. The type and strength of the magnetic field used in the alignment step depends on such factors as particle size, separation of the particles, and green density and is readily determinable by those skilled in the art. An alternating field superimposed on the DC field was found to produce particle vibration which facilitated orientation of the loose powder. Compacting and sintering are accomplished by conventional powder metallurgial techniques. It is important to maintain a good degree of alignment in the compound during the compacting stage. This can be accomplished by applying pressure to the particles while in the magnetic field in order to mechanically interlock the particles.

The sintered product obtained by the foregoing process has superior magnetostriction as compared with a randomly oriented compound. Greatly enhanced magnetostriction is obtained when the rare earth-iron Laves phase compound is one which has its axis of easy magnetization along the [111] direction.

The following example is illustrative of the present invention. The pseudobinary system $(Tb_xDy_{1-x})Fe_2$ with x close to 0.3 was selected because this composition is particularly well suited for a wide range of device applications. At this composition, a relatively large magnetostriction is associated with minimal magnetic anisotropy. Spin orientation diagrams show that this compound, at room temperature, has its axis of easy magnetization along the major cubic symmetry [111] direction.

EXAMPLE

Preparation of $Tb_{0.3}Dy_{0.7}Fe_2$ consisted of arc melting elemental rare earth metals and iron, all of 99.9% purity, on a water cooled copper hearth under a Zr gettered argon atmosphere. After a homogenizing anneal at 1000° C. in evacuated quartz capsules, the buttons were crushed and pulverized by ball milling under toluene in a steel planetary mill for 20 minutes. The resulting powder was rinsed with acetone and vacuum dried. Rubber tubing, $\frac{3}{4}''$ I.D. and $1\frac{1}{2}''$ long, was manually filled with powder.

The powder was then aligned in DC fields up to 20 KOe. An alternating field of approximately 1000 Oe peak-to-peak at frequencies up to 500 Hz was superimposed on the DC field in order to produce sufficient particle vibration to facilitate orientation of the loose powder. While in the magnetic field, the powder particles were mechanically interlocked by compaction by means of hand applied end compression with a plunger. Alternatively, the particles can be locked in position by evacuating the rubber tube. The tube was then hydrostatically compressed at 70 Kg/mm². The cold pressed samples were subsequently wrapped in tantalum foils and sintered in a dynamic vacuum of $3 \times 10^{-6}$ mm Hg in the 950°–1050° C. temperature range for durations up to 12 h. The samples were evaluated by optical microscopy, X-ray diffraction patterns, X-ray pole figures and magnetostriction measurements. Samples measuring approximately 2 cm² by 0.3 cm thick were polished through a 1μ diamond wheel and, after etching, were used to obtain X-ray diffraction patterns and pole figures. Plane orientations were determined by the Schulz method using a Picker diffractometer with an X-ray monochromator. Intensities of (440) reflections were recorded as ω (the angle of reflecting plane with the sample surface), and φ (the azimuth angle from the longitudinal directions of the sample) were changed. A temperature compensated circuitry with commercially available strain gauges from Micro-Measurements was used to determine the magnetostrains.

FIG. 1 shows the X-ray diffraction patterns of random and magnetically oriented $Tb_{0.3}Dy_{0.7}Fe_2$ compound. It can be seen that in the surface perpendicular to the magnetic field, the diffraction intensity from (220) planes has decreased whereas the intensity of (222) reflection has increased, to a substantial degree, with respect to the intensities of reflections from these planes in an almost randomly oriented powdered compound.

Figure 2:
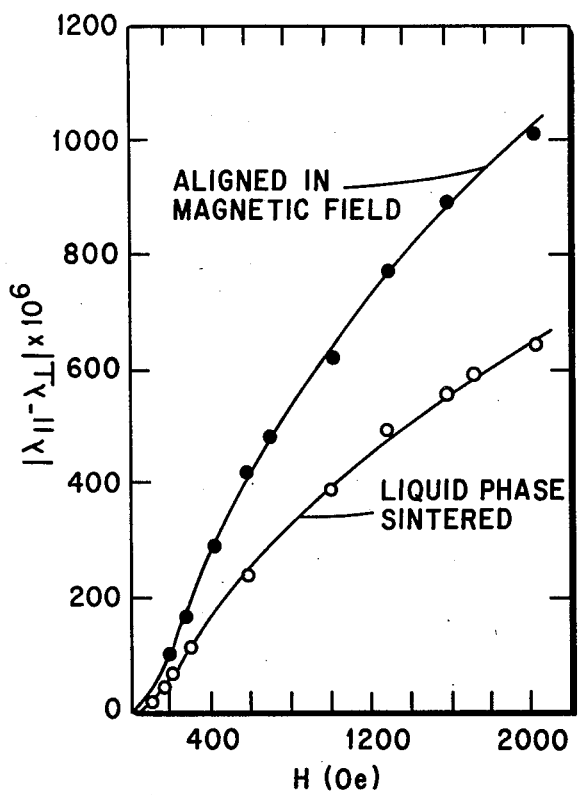
FIG. 2 is a graph comparing the magnetostrictive properties of a magnetically aligned $Tb_{0.3}Dy_{0.7}Fe_2$ compound of the present invention and a highly dense liquid phase sintered compound which is not aligned.
Figure 3:
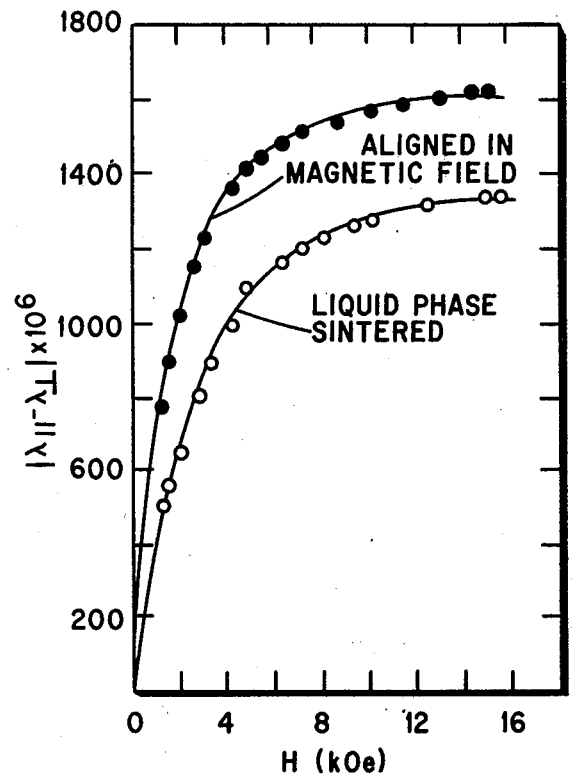
FIG. 3 is a graph comparing the saturation magnetostrictions for the aligned $Tb_{0.3}Dy_{0.7}Fe_2$ and the highly dense liquid phase sintered material.

FIG. 2 is a graph comparing low field magnetostriction measurements at room temperature for the aligned $Tb_{0.3}Dy_{0.7}Fe_2$ compound and for a highly dense (95% theoretical density) liquid phase sintered compound prepared as described in Malekzadeh, et al., op. cit. which is not aligned. FIG. 2 shows that with regard to both magnetostrains and rate of approach to saturation, the aligned material, though porous, is much superior to the highly dense sintered compound which is not aligned. This superiority is possibly due to the effect of the preferred grain orientation on reducing the large internal strains at grain boundaries associated with highly magnetostrictive materials. Also, in rare earth-iron Laves phase compounds $\lambda_{111} \gg \lambda_{100}$ due to a structural distortion associated with the [111] easy direction of magnetization ($\lambda_{100}$ and $\lambda_{111}$ are single crystal magnetostriction constants of cubic crystals in directions $\langle 100 \rangle$ and $\langle 111 \rangle$ respectively.) Since for a polycrystalline material with random grain orientation, the saturation magnetostriction can be expressed as $\lambda_s = (2\lambda_{100} + 3\lambda_{111})/5$, magnetic alignment of these compounds orienting the crystallites along the [111] easy axis enhances their saturation magnetostriction drastically. This is illustrated in FIG. 3 where the saturation magnetostriction for the aligned $Tb_{0.3}Dy_{0.7}Fe_2$ shows a 20% increase over the unaligned highly dense liquid phase sintered material.

Figure 4:
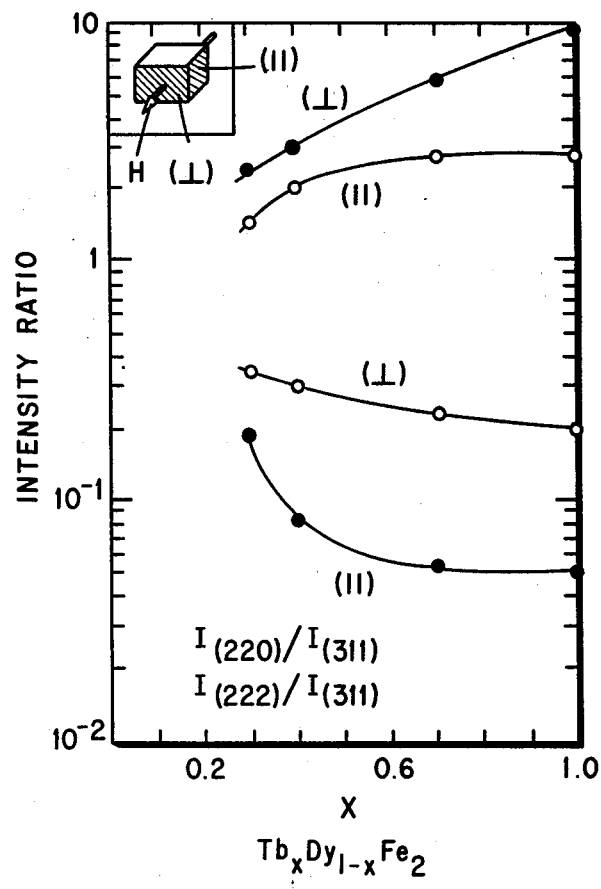
FIG. 4 is a graph of the relative intensity of reflections from (220) and (222) planes plotted against values of x in $Tb_xDy_{1-x}Fe_2$.
Figure 5:
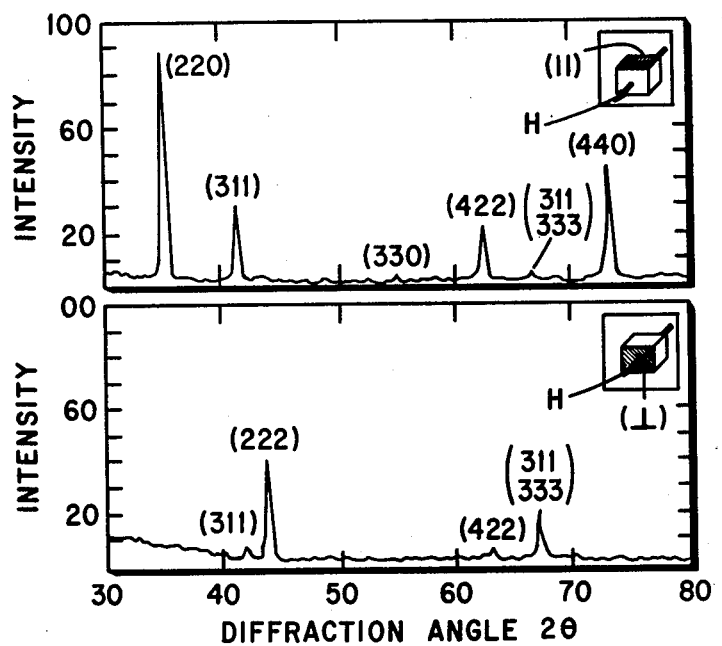
FIG. 5 shows X-ray diffraction patterns taken from aligned sintered $TbFe_2$ materials.
Figure 6:
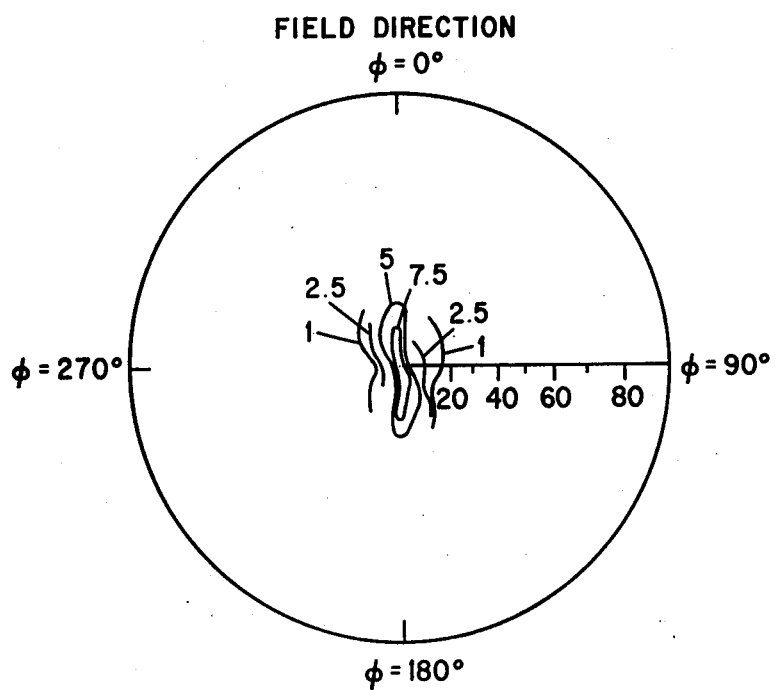
FIG. 6 shows a (440) pole figure for an aligned $TbFe_2$ sintered rod.

It was also found that the alignment improves as the value of x in $Tb_xDy_{1-x}Fe_2$ is increased, as is shown in FIG. 4 where the relative intensity of reflections from (220) and (222) planes are plotted against values of x. This is attributed to the fact that $Tb_xDy_{1-x}Fe_2$ has a minimal anisotropy near $x = 0.3$. An increase in x will increase the anisotropy making an improvement in the alignment degree possible. This is evident in FIG. 5 which shows X-ray diffraction patterns taken from aligned sintered $TbFe_2$ materials. In the plane perpendicular to the direction of the field, the (220) reflection is almost nonexistent whereas the reflection from (222) planes has the strongest intensity. FIG. 6 shows a (440) pole figure for an aligned $TbFe_2$ sintered rod with contours of constant intensity around the (440) pole, at the center. An optimization study can provide the optimum value for x at which the increase in anisotropy is offset by the improvement in alignment.

Although a decrease in x toward a Dy richer compound also will increase the magnetic anisotropy, this is not preferred since $DyFe_2$ has its easy direction of magnetization along the [100] direction instead of along the [111] direction, thus not contributing as much to the magnetostriction.

Thus it has been shown that the present invention provides a product having superior magnetostriction. The magnetostrains observed in the oriented products of this invention are far superior to those of arc cast and highly dense liquid phase materials which have similar compositions but have a random grain orientation. The products of this invention can be formed into any desired size or shape for use in a wide variety of electroacoustical devices, for example, for underwater sound generation purposes, for detection of flaws in materials, and the like.

Although the invention has been hereinbefore described with reference to a specific example, various changes and modifications will be apparent to those skilled in the art.

What we claim is:

1. A magnetostrictive sintered product consisting essentially of a compact body compounded of particles of a rare earth-iron Laves phase magnetostrictive compound having the formula $RFe_2$ where R represents one or more rare earth metals and characterized by a grain oriented morphology achieved by aligning the particles under the influence of a magnetic field prior to sintering whereby the particles are oriented along the easy axis of magnetization thereof.

2. A magnetostrictive sintered product as in claim 1 wherein the rare earth-iron compound has its axis of easy magnetization along the [111] direction.

3. A magnetostrictive sintered product as in claim 2 wherein the rare earth-iron compound has the formula $Tb_xDy_{1-x}Fe_2$ wherein x is at least about 0.3.

4. A magnetostrictive sintered product as in claim 3 wherein x is about 0.3.

5. A method for preparing an improved sintered rare earth-iron Laves phase magnetostrictive alloy product which comprises:
  providing a powder of a rare earth-iron Laves phase magnetostrictive compound having the formula $RFe_2$ where R represents one or more rare earth metals;
  subjecting the powder particles to a magnetic field sufficient to substantially align the particles;
  compressing the magnetically particles aligned to form a compact body while substantially maintaining the degree of magnetic alignment; and sintering the resulting compact body.

6. The method of claim 5 wherein the rare earth-iron Laves phase magnetostrictive compound has its axis of easy magnetization along the [111] direction.

7. The method of claim 6 wherein the rare earth-iron Laves phase magnetostrictive compound has the formula $Tb_xDy_{1-x}Fe_2$ wherein x is at least about 0.3.

8. The method of claim 7 wherein x is about 0.3.

* * * * *